(12) United States Patent
Mirov et al.

(10) Patent No.: US 8,284,805 B2
(45) Date of Patent: Oct. 9, 2012

(54) ELECTRICALLY PUMPED BROADLY TUNABLE MID-INFRARED LASERS BASED ON QUANTUM CONFINED TRANSITION METAL DOPED SEMICONDUCTORS

(75) Inventors: Sergey B. Mirov, Vestavia Hills, AL (US); Vladimir V. Fedorov, Vestavia Hills, AL (US); Dmitri Martyshkin, Birmingham, AL (US)

(73) Assignee: The UAB Research Foundation, Birmingham, AL (US)

( * ) Notice: Subject to any disclaimer, the term of this patent is extended or adjusted under 35 U.S.C. 154(b) by 324 days.

(21) Appl. No.: 12/282,874

(22) PCT Filed: Mar. 12, 2007

(86) PCT No.: PCT/US2007/006233
§ 371 (c)(1),
(2), (4) Date: Feb. 3, 2009

(87) PCT Pub. No.: WO2007/106444
PCT Pub. Date: Sep. 20, 2007

(65) Prior Publication Data
US 2009/0304034 A1    Dec. 10, 2009

Related U.S. Application Data

(60) Provisional application No. 60/781,964, filed on Mar. 13, 2006.

(51) Int. Cl.
*H01S 3/10* (2006.01)
(52) U.S. Cl. .................. 372/20; 372/45.012
(58) Field of Classification Search .............. 372/20, 372/45.012
See application file for complete search history.

(56) References Cited

U.S. PATENT DOCUMENTS

2002/0041610 A1* 4/2002 Scully et al. ............... 372/4
2005/0287691 A1* 12/2005 Chen et al. ................ 438/29
* cited by examiner

*Primary Examiner* — Patrick Stafford
(74) *Attorney, Agent, or Firm* — Perkins Coie LLP

(57) ABSTRACT

Electrically pumped mid-IR semiconductor lasers that are operable at room temperature and possess a range of tunability up to 1100 nm, which constitutes a revolutionary (1-2 orders of magnitude) improvement in the range of tunability over existing semiconductor laser technology utilizing Doped quantum confined host material (DQCH) with characteristic spatial dimension of the confinement tuned to enable the overlap of the discrete levels of the host and impurity ions and efficient energy transfer from the separated host carriers to the impurity, wherein: said DQCH material has the formula TM:MeZ and/or $MeX_2Z_4$, wherein Me is selected from the group consisting of Zn, Cd, Ca, Mg, Sr, Ba, Hg, Pb, Cu, Al, Ga, In; Z is selected from the group consisting of S, Se, Te, O, N, P, As, Sb and their mixtures; X being selected from the group consisting of Ga, In, and Al; and TM is selected from the group consisting from V, Cr, Mn, Fe, Co, and Ni.

20 Claims, 7 Drawing Sheets

Au electrode 2-5μm 1-2μm Guiding 2-5μm Cladding

In electrode p-$Zn_xMg_{1-x}S_ySe_{1-y}$
p-$ZnS_{1-x}Se_x$
$Zn_xCd_{1-x}Se$:TM
*(OW Active layer1-30nm)*
n-$ZnS_{1-x}Se_x$
n-$Zn_xMg_{1-x}S_ySe_{1-y}$
$n^+$-ZnSe
n-GaAs substrate

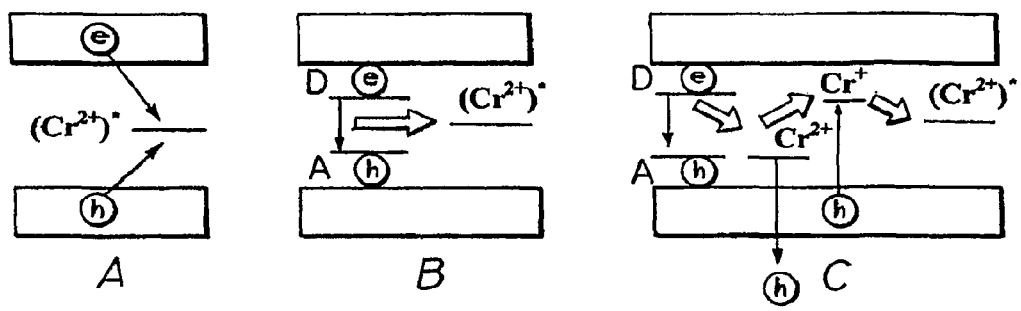
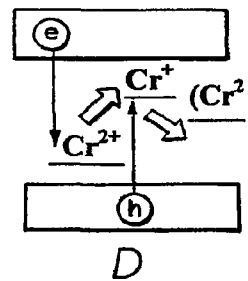
Fig. 1
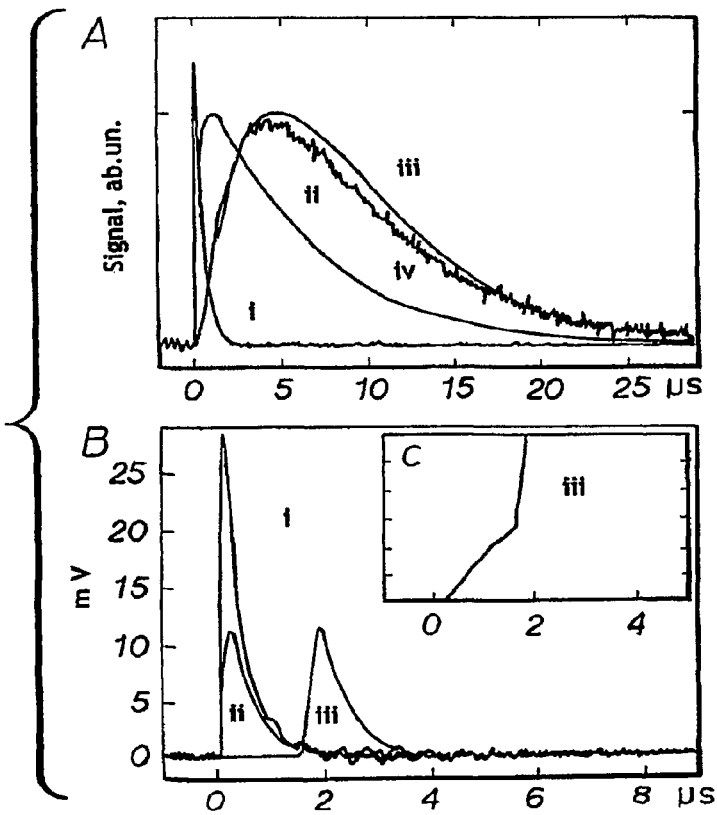
Fig. 2

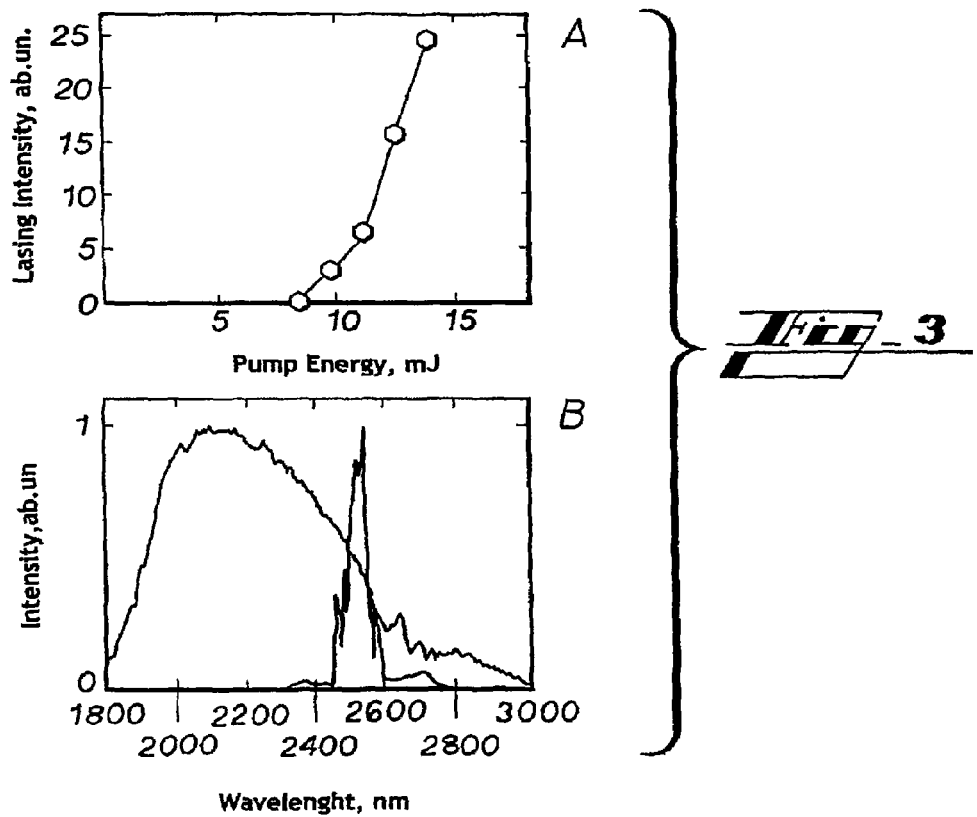
Fig. 3
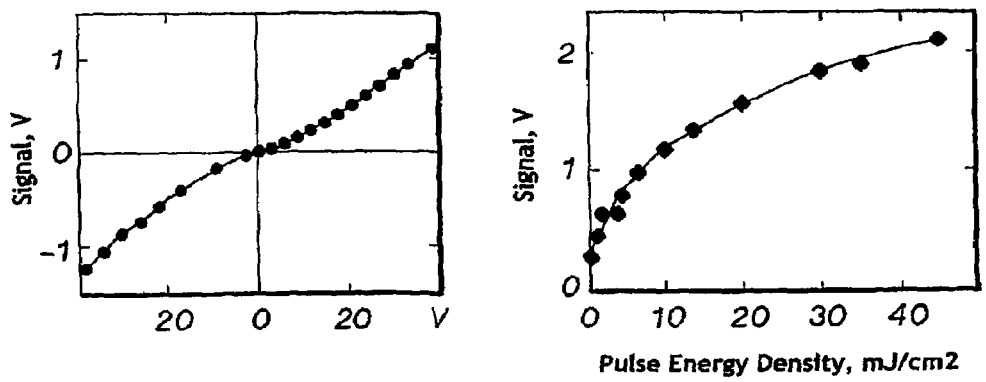
Fig. 4
Fig. 5

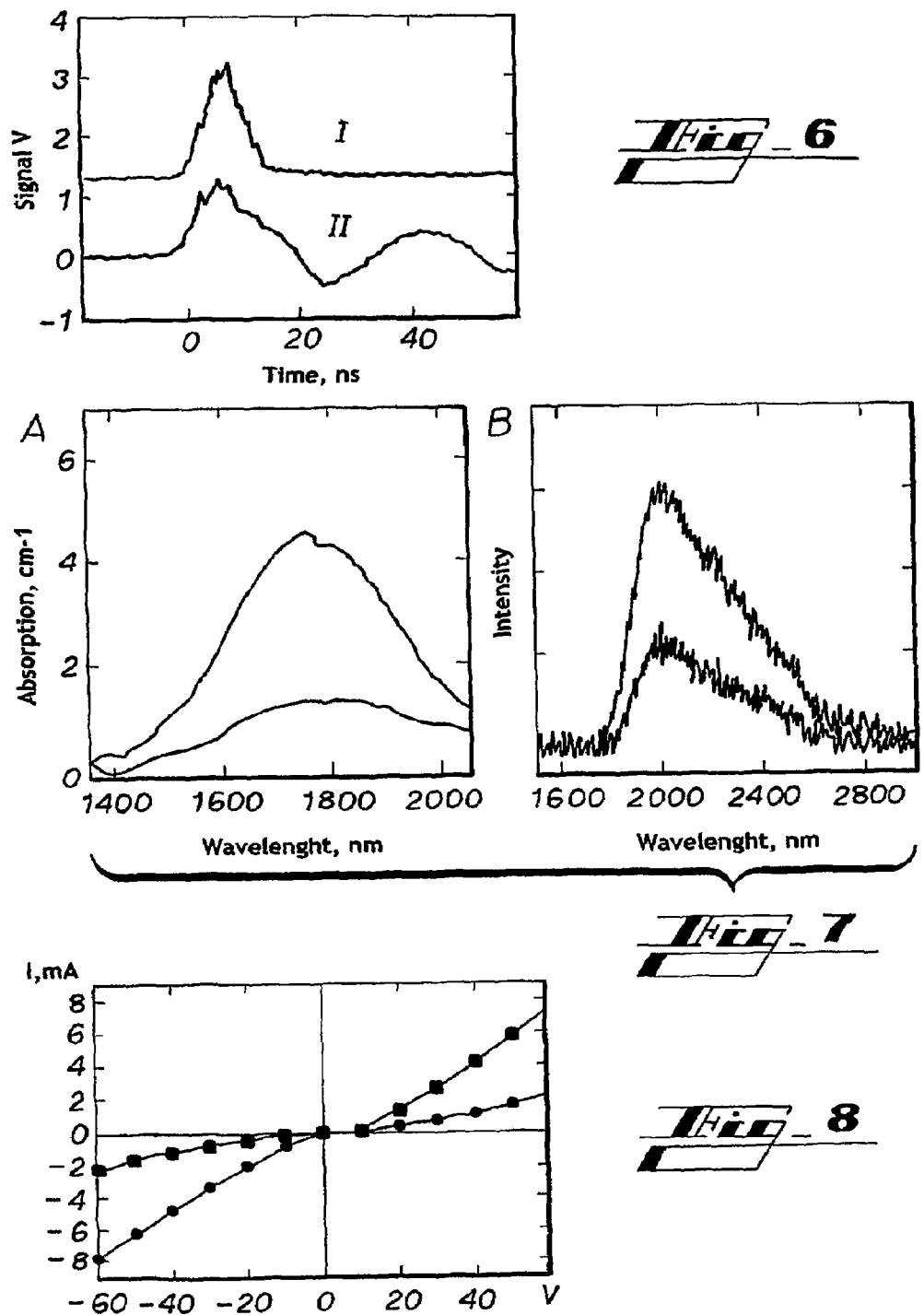
Fig_6
Fig_7
Fig_8

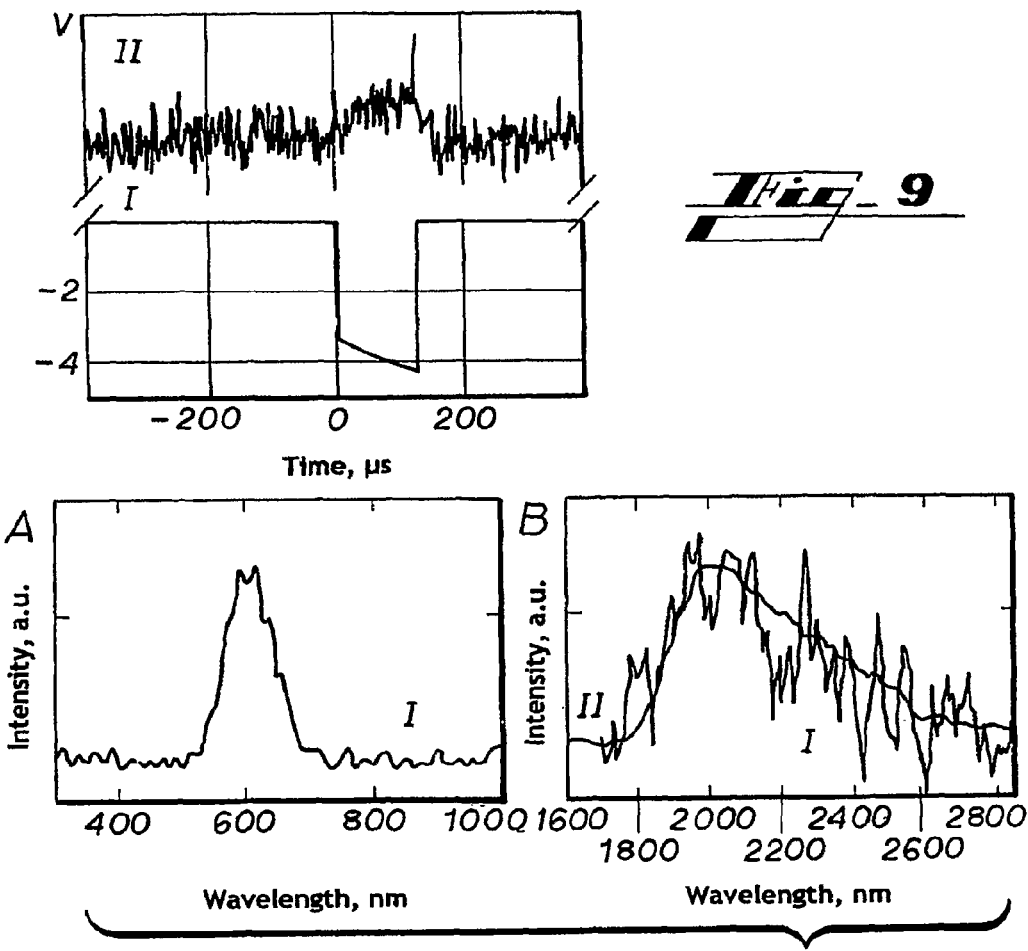
Fig. 9
Fig. 10
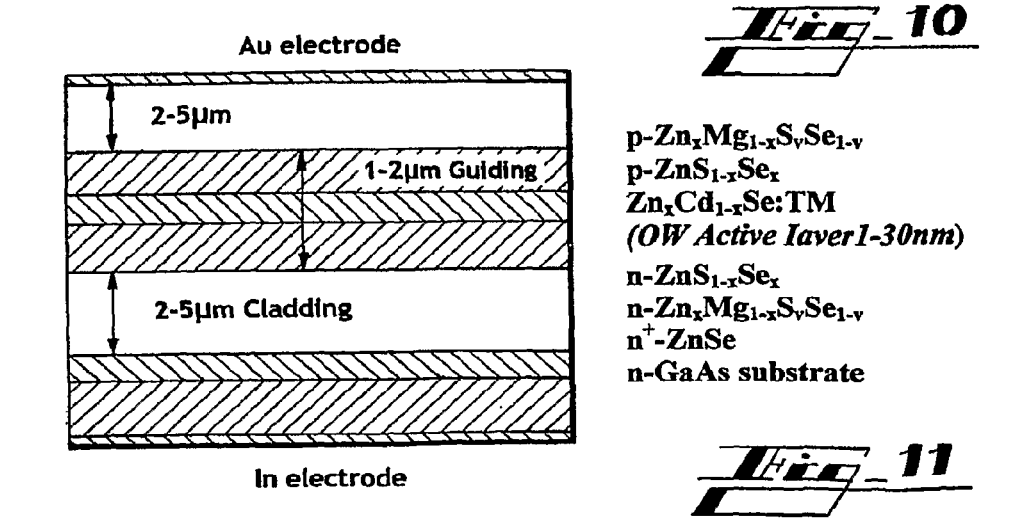
p-$Zn_xMg_{1-x}S_ySe_{1-y}$
p-$ZnS_{1-x}Se_x$
$Zn_xCd_{1-x}Se$:TM
(QW Active layer 1-30nm)
n-$ZnS_{1-x}Se_x$
n-$Zn_xMg_{1-x}S_ySe_{1-y}$
$n^+$-ZnSe
n-GaAs substrate
Fig. 11

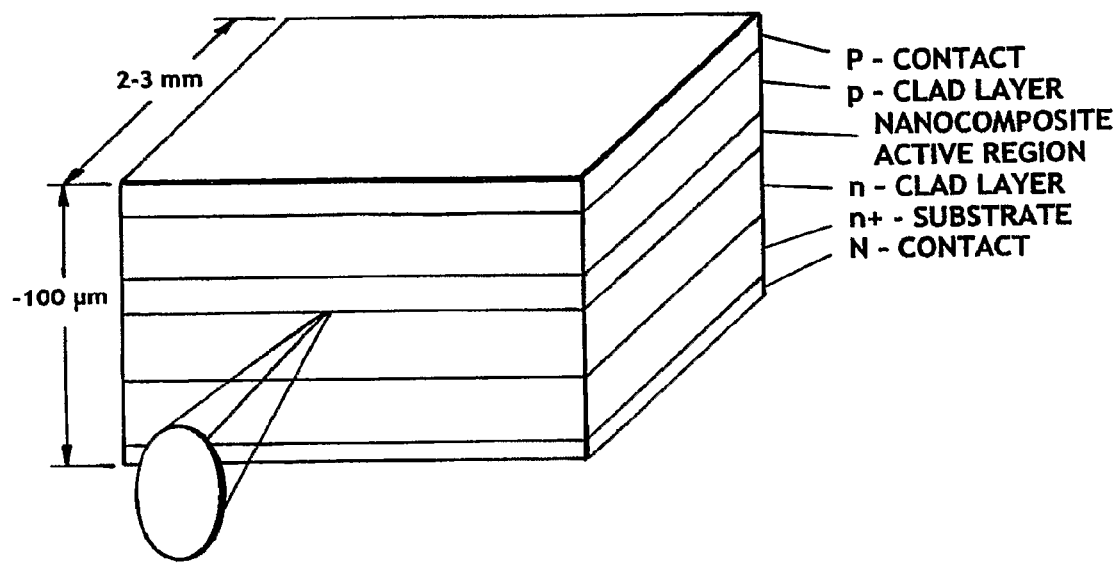
Fig_12

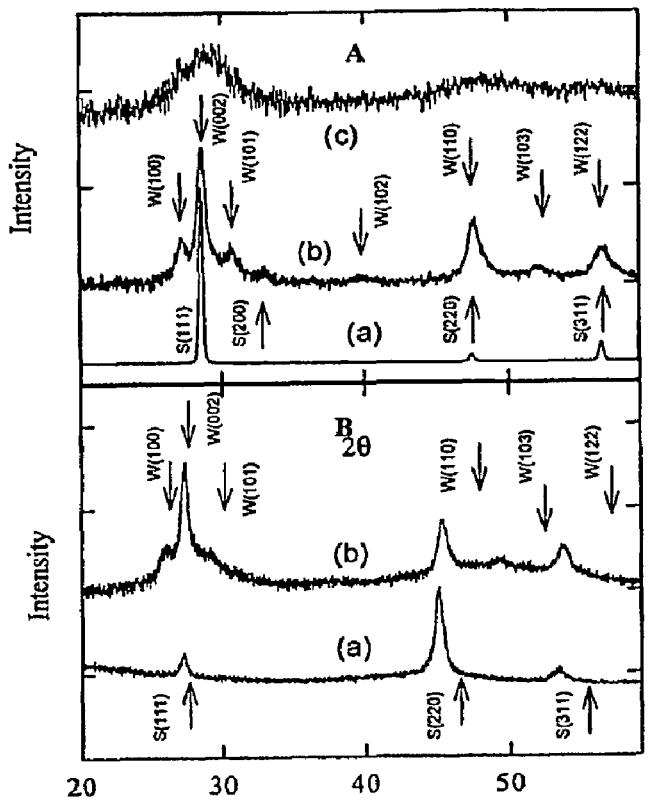
FIG. 13 A & B
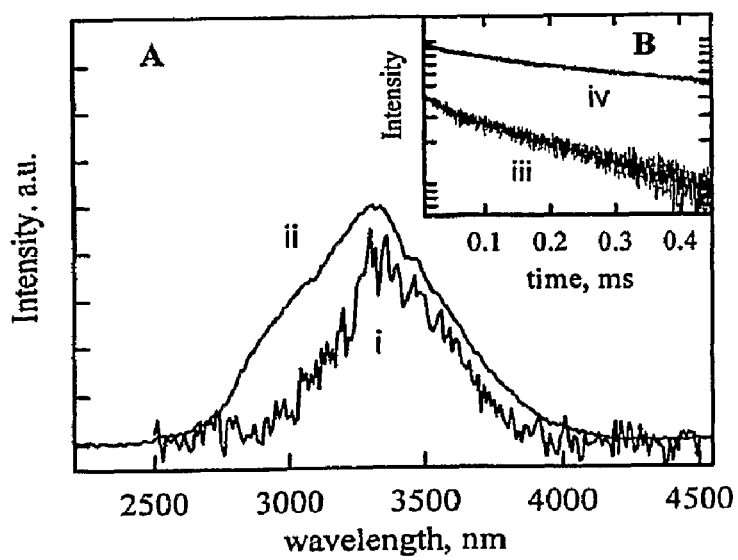
FIG 16 A & B

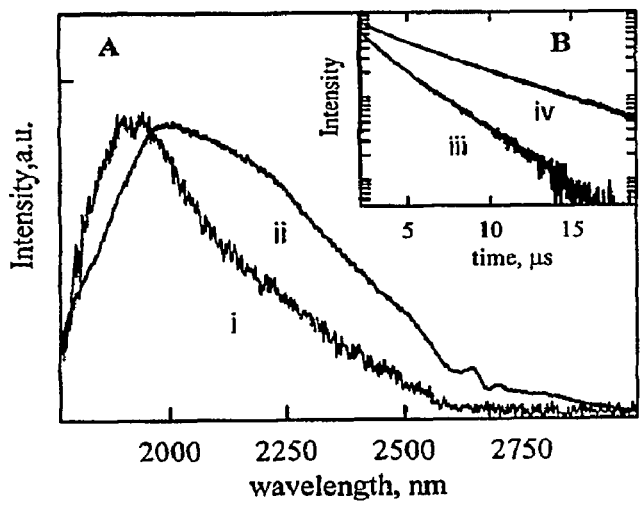
FIG 14A & B
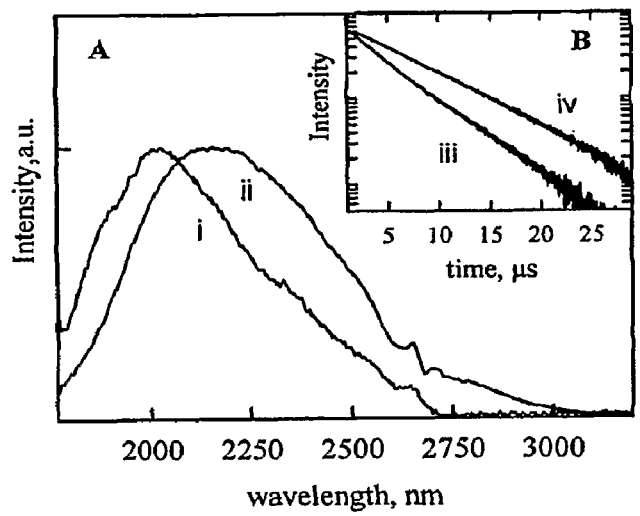
FIG 15A & B
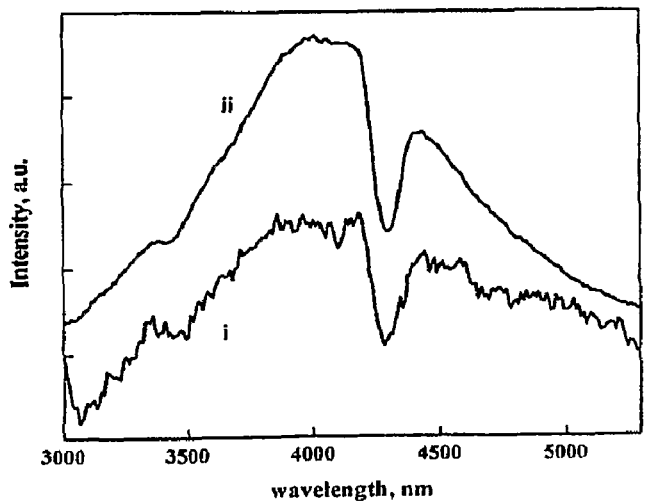
FIG 17

ELECTRICALLY PUMPED BROADLY TUNABLE MID-INFRARED LASERS BASED ON QUANTUM CONFINED TRANSITION METAL DOPED SEMICONDUCTORS

CROSS-REFERENCE TO RELATED APPLICATIONS

This application is a U.S. National Phase application of and claims priority to PCT Application Serial No. PCT/US07/006,233, filed Mar. 12, 2007, which claims priority to U.S. Provisional Application Ser. No. 60/781,964, filed Mar. 13, 2006. The disclosures of the prior applications are considered part of (and are incorporated by reference in) the disclosure of this application.

FIELD OF THE INVENTION

The present invention relates to lasers and their uses. More particularly the present invention relates to electrically pumped tunable lasers operating in the Middle Infrared (Mid-IR) range. In even greater particularity the present invention relates to a new class of electrically pumped broadly tunable semiconductor lasers. Still more particularly, the present invention relates to middle infrared lasers based on quantum confined transition metal (TM) doped II-VI semiconductor structures.

BACKGROUND

There is a growing demand for affordable mid-infrared sources for use in a variety of applications including atmospheric sensing, eye-safe medical laser sources for non-invasive medical diagnostics, eye-safe laser radar and remote sensing of atmospheric constituents, optical communication, and numerous military applications. Recent research advances have spurred considerable effort in the development of practical mid-IR sources. This work has included direct generation in semiconductors using InAsSbP/InAsSb/InAs [1] and quantum cascade lasers [2,3,4]. Mid-IR wavelengths have also been generated using nonlinearities in Optical Parametric Oscillators (OPOs) [5,6] and Difference Frequency Generators (DFGs) [7]. All of these approaches yield tunable sources in the mid-IR. However, all suffer some fundamental problems that limit their use as robust low-cost mid-IR source. OPOs and DFGs are expensive and bulky. Quantum cascade lasers are costly to manufacture, require low operating temperatures, and feature limited output power and range of tunability.

In parallel to the relatively large body of work using the approaches described above, there has been a significant effort on the direct mid-IR oscillation of crystals doped with rare-earth (RE) or TM ions. Long wavelength RE and TM emissions are usually quenched by multi-phonon processes in conventional laser host media such as oxide and fluoride crystals, resulting in low room-temperature quantum efficiency of fluorescence.

Scientists from the Lawrence Livermore National Laboratory [8,9,10] were first to show that among all the solid state laser media $TM^{2+}$ doped wide bandgap II-VI semiconductor crystals could be very special for mid-IR lasing. These $TM^{2+}$ doped II-VI compounds have a wide bandgap and possess several important features that distinguish them from other oxide and fluoride laser crystals. These features are as follows:

An important feature of the II-VI compounds is their tendency to crystallize as tetrahedrally coordinated structures, as opposed to the typical octahedral coordination at the dopant site. Tetrahedral coordination gives smaller crystal field splitting, placing the dopant transitions further into the IR.

A key feature of these materials is that the heavy anions in the crystals provide a very low energy optical phonon cutoff that makes them transparent in a wide spectral region and decreases the efficiency of non-radiative decay, which gives a promise of a high yield of fluorescence at room temperature (RT). One can expect that in the column of anions from S, Se to Te the yield of RT fluorescence will increase.

Analysis of multiplet structure for low lying energy levels of $V^{2+}$, $Cr^{2+}$, $Mn^{2+}$, $Fe^{2+}$, $Co^{2+}$, $Ni^{2+}$ in ZnSe and ZnS calculated by Fazzio et al [11] and performed in [12] explains why the attention of researchers is mainly focused on $Cr^{2+}$ and $Fe^{2+}$ ions as the most promising dopants for effective broadly tunable lasing over 2-3 and 3.7-5 μm spectral regions, respectively.

First excited levels of all considered ions except $Mn^{2+}$ lie at the right energy to generate mid-IR emission.

The ground and first excited levels of all the considered ions except $Mn^{2+}$ have the same spin, and therefore will have a relatively high cross-section of emission.

Higher lying levels of only two ions—$Cr^{2+}$ and $Fe^{2+}$—have spins that are lower than the ground and first excited levels, greatly reducing the potential for significant excited state absorption at the pump or laser transition wavelengths.

The orbital characteristics of the ground and first excited levels for $Cr^{2+}$, $Fe^{2+}$ and $Co^{2+}$ are different, and will experience a significant Franck-Condon shift between absorption and emission, resulting in broadband "dye-like" absorption and emission characteristics, suitable for a broadly tunable laser.

After pioneering publications [8,9,10] mid-IR laser activity near 2-5 μm has been reported for $Cr^{2+}$:ZnS [9,10,13,14,15], $Cr^{+}$:ZnSe [9,10,13,14,15,16,17,18,19,20,21,22,23], $Cr^{2+}$:$Cd_{1-x}Mn_xTe$ [24], $Cr^{2+}$:CdSe [25], and $Fe^{2+}$:ZnSe [26] crystals. Recently we optimized technology for ZnS and ZnSe crystal preparation [13,14,27,28]. The technology includes the steps of growing (Chemical, Physical Vapor Transport or other methods) or purchasing II-VI host crystal materials (ceramic infrared window or single crystal) from commercial vendors followed by cutting them into polished wafers of thickness 0.1-3 mm; introducing transitional metal (e.g. Cr) thin film of controllable thickness on the wafer facets by means of pulse laser deposition, plasma sputtering, cathode arc deposition, or other methods; thermal annealing of the crystals with or without simultaneous action of electric field for effective thermal diffusion of the dopant into the crystal volume with a temperature and exposition time providing highest concentration of the dopant in the volume without degrading laser performance due to scattering and concentration quenching; polishing wafer facets; direct deposition of mirrors on flat and parallel polished facets of a II-VI wafer; and dicing of the wafer into individual microchips.

This methodology provides the most cost effective route for fabrication of mid-infrared gain materials, microchip lasers and saturable absorbers with a collective fabrication process enabling low cost mass production with good reproducibility, reliability, and simplicity.

Several impressive results have been recently obtained with these new crystals:

1) We developed the first continuous-wave room-temperature tunable over more than 280 nm at ~2.3 μm $Cr^{2+}$:ZnS laser, pumped with a Co:$MgF_2$ laser and yielding over 100 mW of output power [29].
2) Another key result is the first successful demonstration of CW $Cr^{2+}$:ZnS and ZnSe microchip lasers with the maximum output powers of 500 mW at 2320 nm and slope efficiency of 53% under direct (without coupling optics) Er-fiber laser excitation [27, 30,33,34].
3) We also developed the first gain switched $Cr^{2+}$:ZnSe microchip laser. A maximum slope efficiency of 6% and a maximum output energy of 1 mJ were obtained for a microchip without mirrors, when positive feedback was due only to the Fresnel reflections [30,34].
4) First tunable directly diode-pumped, by the two conventional 500 mW InGaAsP—InP telecom laser diodes, version of CW $Cr^{2+}$:ZnS laser was also reported. Tunability over 400 nm between 2250 and 2650 nm was achieved [31, 32].
5) In an external cavity configuration a compact Er-fiber laser pumped broadly tunable over ~700 nm between 2170 and 2840 nm CW room-temperature $Cr^{2+}$:ZnS laser was realized, yielding up to 700 mW at ~40% slope efficiency [33,34].
6) First multiline and ultrabroadband lasing of $Cr^{2+}$:ZnSe in a spatially dispersive cavity has been realized [35].
7) Finally, first room-temperature gain-switched lasing of Fe:ZnSe was achieved in microchip and selective cavity configurations with tunability over 3.8-5.1 μm spectral range [36,37].

The described above survey of scientific literature and our research leads us to believe that optically pumped lasers based on TM:II-VI crystals are very promising mid-IR lasers sources with very favorable output characteristics in CW, gain-switched, and mode-locked regimes of operation at room temperature. It also shows that current methods of pumping the TM ions in II-VI crystals utilize only direct intra-shell excitation of impurity Electrically pumped mid-IR lasers based on TM doped II-VI structures would be ideal for compact and portable lasers in the mid-IR, however, they have not been documented in the prior art. The present invention shows that in addition to effective RT mid-IR lasing TM doped II-VI media, being semiconductors, hold potential for direct electrical excitation. There are several factors necessary to be satisfied to make direct electrical excitation possible. The invention brings these factors together to enable new class of electrically pumped broadly tunable mid-IR lasers.

SUMMARY OF THE INVENTION

The essence of the present invention is a novel approach for producing electrically pumped mid-IR semiconductor lasers that are operable at room temperature and possess a range of tunability up to 1100 nm, which constitutes a revolutionary (1-2 orders of magnitude) improvement in the range of tunability over existing semiconductor laser technology.

In other words on the contrary to conventional semiconductor lasers where the semiconductor host is pumped by electrical excitation and lasing occurs due to band-band recombination of separated carriers, in our case lasing occurs due to stimulated transitions in the impurity. To make it possible the present invention recognizes and utilizes the following factors:
1) Electrical excitation of the semiconductor host is a well documented technology.
2) There are several mechanisms (e.g. charge transfer, Auger recombination, collision of carriers with impurity, impact ionization) responsible for energy transfer from the bulk host to the impurity. Transition from the doped bulk to doped quantum size confined structures could be accompanied by a significant increase of the efficiency of energy transfer from the host to the TM impurity.
3) Although nanocrystallites have not yet completed their evolution into bulk solids, structural studies indicate that they have the bulk crystal structure and lattice parameter. This provides a strong foundation for our hypothesis that similarly to the bulk II-VI crystals, tetrahedral coordination of $TM^{2+}$ centers in II-VI nanocrystallites will provide a small crystal field splitting and place the dopant transitions into the mid-IR. Moreover, because the radii of the excited states of an impurity (0.1 to 1 nm) are significantly smaller than the typical Bohr radii of exciton in semiconductors (3-10 nm) the wavelength of the impurity characteristic fluorescence should hardly change.
4) The advantageous properties of doped quantum confined structures in terms of efficient energy transfer from the host to the impurity and their capability to luminesce in the mid-IR at room temperature combined with proper design of nanocomposite or doped quantum well structures will enable efficient mid-IR lasing under electrical excitation.

Hence, it is the object of invention to provide a new class of semiconductor gain media for electrically pumped mid-infrared lasers comprising doped quantum confined host material (DQCH) with characteristic spatial dimension of the confinement tuned to enable the overlap of the discrete levels of the host and impurity ions and efficient energy transfer from the separated host carriers to the impurity, wherein: said DQCH material has the formula TM:MeZ and/or $MeX_2Z_4$, wherein Me is selected from the group consisting of Zn, Cd, Ca, Mg, Sr, Ba, Hg, Pb, Cu, Al, Ga, In; Z is selected from the group consisting of S, Se, Te, O, N, P, As, Sb and their mixtures; X being selected from the group consisting of Ga, In, and Al; and TM is selected from the group consisting from V, Cr, Mn, Fe, Co, and Ni. The preferred embodiments of said DQCH material include ZnS, ZnSe, ZnTe, CdS, CdSe, CdTe and their mixtures doped with Cr, Fe, and Co, prepared in a form of quantum dots embedded in electro-conductive polymers, or in a form of active layer of quantum dots, or quantum well as integral part of a double heterostructure system providing simultaneous confinement of carriers and photons in the active quantum well layer.

Another object of the invention to provide a method for producing said DQCH semiconductor gain medium using chemical (sol-gel) or physical (laser ablation) technologies.

It is an additional object of this invention to provide a mid-IR tunable laser system comprising electrical excitation, said DQCH gain medium and dispersive positive feedback.

BRIEF DESCRIPTION OF THE DRAWINGS

The Drawings appended hereto and referred to herein illustrate various parameters that are important in understanding the invention and form an integral part of this application, wherein:

FIG. 1A to 1D depict four major mechanisms of inter-band excitation of intra-shell mid-IR emission or $Cr^{2+}$ and $Fe^{2+}$ ions.

FIGS. 2A and 2B demonstrate sub-band optical excitation of $Cr^{2+}$ via photoionization transitions: (A) ionization through single-photon interaction, and (B) multi-step ionization utilizing two pump photons and leading to the generation of two-mid-IR photons.

FIG. 3 illustrates temporal shape of 532 nm excitation pulse (I) and photo-conductance voltage on the 50Ω load resistor (II).

FIG. 4 shows dependence of the potential difference across 3-4 contacts as a function of applied voltage in the forward 1-2 direction for variable intensity of 532 nm excitation. The voltage measured across the sample drops after a threshold level is reached in the forward (1-2) direction. This threshold level is reduced as the intensity of the 532 nm source is increased.

FIG. 5 depicts (A) Kinetics of Cr:ZnSe single crystal mid-IR photoluminescence at ~2500 nm under (ii) 1560 nm (iii) 532 nm (iv) 355 nm pumping with pump temporal profile shown in (i). (B) Dynamics of Cr:ZnSe laser oscillation build-up. Pulse (i) shows the pump pulse. Pulse (ii) shows the temporal profile of the lasing pulse from 1560 nm excitation. Pulse (iii) shows the temporal profile of the lasing pulse from 532 nm excitation. The inset (C) is a blow-up of the build-up part of the temporal profile of the 2500 nm lasing pulse under 532 nm excitation. This plot shows that ~2 μsec build up time is required before mid-IR lasing occurs under 532 nm excitation.

FIG. 6 shows (A) Lasing output versus pump energy incident upon the entire laser crystal. The threshold for lasing is ~7.5 mJ at 532 nm. (B) (i) PL spectrum of Cr:ZnSe polycrystalline sample under 532 nm excitation. (ii) The spectrum of $Cr^{2+}$ lasing under 532 nm excitation.

FIG. 7 illustrates conductivity measurements of Cr:Al:ZnSe with In contacts for small (A) and large (B) potential differences across the sample.

FIG. 8 shows temperature dependences of the current through the sample (A) and the amplitude of the mid-IR electroluminescence (B).

FIG. 9 depicts the oscilloscope traces of the voltage across the sample (I) and the mid IR optical signal (II).

FIG. 10 shows visible (A) and Mid-IR (B) emission spectra of n-type Cr:Al:ZnSe under electrical (curve-I) and direct optical $^5T_2 \leftrightarrow ^5E$ excitation (curve-II).

FIG. 11 illustrates a general Doped Quantum Confined Host (QD or QW) laser structure.

FIG. 12 illustrates possible low-dimensional Quantum well multilayer structures comprising cladding, guiding, active, and capping layers on a GaAs substrate.

FIG. 13 illustrates XRD diffraction pattern in A of $Cr^{2+}$ doped ZnS and in B of ZnSe nanocrystalline quantum dots (NCD) after first and second stages of laser ablation.

FIG. 14A illustrates room temperature luminescence spectra of Cr doped ZnS NCD and bulk samples and 14 B illustrates the kinetics of the dots measured at room and 77K temperatures.

FIG. 15A illustrates room temperature luminescence spectra of Cr doped ZnSe NCD and bulk samples and 15B illustrates the kinetics of the dots measured at room and 77K temperatures.

FIG. 16A illustrates room temperature luminescence spectra of Co doped ZnSe NCD and bulk samples and 16 B illustrates the kinetics of the dots measured at room and 77K temperatures.

FIG. 17 depicts the Fluorescence of i) ZnSe quantum dots doped with $Fe^{2+}$ prepared by laser ablation and ii) ZnSe polycrystalline bulk sample doped with $Fe^{2+}$.

DESCRIPTION OF THE PREFERRED
EMBODIMENTS AND UNDERLYING THEORY

Excitation Mechanisms of TM Dopant Ions in II-VI
Semiconductors

Inter-Band Excitation of $Cr^{2+}$ and $Fe^{2+}$ in Bulk II-VI Semiconductors

For decades, the pure and doped (Cu and Mn) wide-bandgap II-VI semiconductors have been called promising materials for the fabrication of light-emitting devices and phosphors for electro-luminescent displays. It was noticed more than 50 years ago [38] that the inadvertent presence of TM ions such as chromium or iron provides very effective deactivation of visible light emission from donor-acceptor pair (DAP) or intra-shell transitions of Cu and Mn. $Cr^{2+}$ and $Fe^{2+}$ ions introduce deep energy levels in the forbidden gap, with $^5T_2$ being the ground state and $^5E$ the first excited state for chromium and vice versa for iron [39]. It was determined that in most of the chromium or iron-related recombination processes characteristic intra-center mid-IR emissions of $Cr^{2+}$ and $Fe^{2+}$ are induced ($^5E \rightarrow ^5T_2$) with the wavelength ~2 μm for chromium and $^5T_2 \rightarrow ^5E$, with the wavelength ~3.5-5 μm for iron) [40]. The nature of these processes of inter-band excitation and following Cr or Fe recombination can be quite different. It was found that mid-IR intra-shell PL of chromium and iron can be induced due to the following major processes depicted in FIG. 1.

a) The first process relates to the binding of excitons by Cr and Fe ions. For most of the cases excitons bound by TM ions decay nonradiatively and energy is transferred to states of the impurity, which was binding the exciton (FIG. 1a). So, the energy transfer results in intra-shell excitation $(Cr^{2+})^*$ and not in ionization of a TM ion [41].

b) The second process (see FIG. 1b) relates to TM excitation caused by energy transfer from an adjacent DAP to a TM ion leading to TM intra-shell excitation [42]. As in case a) the energy transfer results in intra-shell excitation and not in ionization of the TM ion.

c) The third process (see FIG. 1c) is due to $TM^{2+}$ ionization caused by an Auger-type process, followed by recapture of the hole or electron by the ionized Cr or Fe and as in case a) leads to mid-IR photoluminescence (PL) [41,43].

d) The fourth process (see FIG. 1d) relates to the fact that carrier trapping by ionized impurities can proceed through one of the highly excited states of the $TM^{2+}$ impurity and thus result in intra-shell emission of TM ions [41,44].

e) The fifth process is a direct excitation of the $Cr^{2+}$ centers in ZnSe by the impact of hot carriers. This mechanism is usually observed in Mn:ZnS thin film electroluminescent (TFEL)devices [45].

f) Another possible mechanism of excitation suggests impact ionization of $Cr^{2+}$ [46].

The fourth process has been considered in details by Kimpel in [44]. Interband optical or electrical excitation generates electron-hole pairs $$hv_g \rightarrow e^-_{CB} + e^+_{VB} \quad (1)$$

Electrons are captured by lattice neutral $Cr^{2+}$ ions which then attain a quasi-negative charge state:

$$(Cr^{2+})^0 + e^-_{CB} + \rightarrow (Cr^+)^- + hv_1 \quad (2)$$

The $Cr^+$ ion with negative effective charge would tend to attract the holes created in the reaction (1) with a subsequent formation of excited state $Cr^{2+}$ according to reaction:

$$(Cr^+)^- + e^-_{VB} + \rightarrow (Cr^{2+})^* + hv_2 \quad (3)$$

and finally a radiative transition (mid-IR PL) to the ground state will close the cycle

  (4)

Alternatively the free holes in the valence bands can be captured by $Cr^{2+}$ impurities:

  (5)

Conduction electrons would then recombine with these positively charged $Cr^{3+}$ levels:

  (6)

Finally reaction (4) will take place leading to the mid-IR PL.

Processes similar to (5) and (6) have been successfully utilized by Klein in [47] where the first observation of laser oscillations at 3.53 μm due to intrashell transitions of the $Fe^{2+}$ centers in n-type InP:Fe under interband optical excitation was reported.

Modeling of $Cr^{2+}$ Excitation via Carrier's Recombination by Optical Sub-Band Photoionization Excitation of $Cr^{2+}$ in Bulk II-VI Semiconductors The information discussed above clearly states that both chromium and iron belong to the most active centers of interband recombination leading to intracenter excitation and mid-IR emission. It is of significant importance to study the nature of the physical mechanisms of $Cr^{2+}$ and $Fe^{2+}$ ions optical interband excitation, to identify the most effective mechanisms and to formulate the conditions necessary for achieving mid-IR lasing. The mechanisms optical sub-band excitation of $Cr^{2+}$ in ZnSe via photoionization transitions are very similar to the processes of $Cr^{2+}$ excitation via carrier's recombination and interband optical excitation. Understanding these mechanisms and achieving lasing of $Cr^{2+}$ ions in ZnSe via its photoionization will be the first important step in demonstrating the feasibility of future $Cr^{2+}$:ZnSe mid-IR lasing under direct electrical excitation.

Photoinduced EPR studies of Chromium doped ZnSe performed by Dr. Godlevski group [40,41,42,43,48] show that the $Cr^{2+}$ center demonstrates an acceptor nature and under optical excitation with energy in excess of ~1.9 eV could release a hole in the valence band, with the $Cr^{2+}$ being ionized into the $Cr^{+}$ state. On the contrary, it has been shown that $Cr^{+}$, in spite of the fact that it is a good trap of holes, could be considered as a donor center. Indeed, under optical excitation with energy larger than ~0.8 eV $Cr^{+}$ releases an electron in the conduction band forming $Cr^{2+*}$ in a highly excited state.

FIG. 2 a) and b) depicts two possible processes of $Cr^{2+}$ optical excitation via ionization transitions. As we have already discussed the $Cr^{2+}/Cr^{+}$ level in ZnSe is located ~0.8 eV below the conduction and ~1.9 eV above the valence band of ZnSe, with a bandgap of ~2.7 eV. According to our notation of FIG. 2 energy of $Cr^{2+}$ acceptor center "$E_{ac}$" is increased in the downward direction, while energy of the donor $Cr^{+}$ center "$E_d$" is increased in the upward direction.

In the first process shown in FIG. 2 a) an incident photon with energy 2.33 eV (532 nm) ionizes the $Cr^{2+}$ ion to the $Cr^{+}$ state by releasing a hole in the valence band:

$$Cr^{+}+h\nu \rightarrow Cr^{+}+e^{+}_{VB}$$  (7)

Subsequently a thermalized hole in the valence band is recombined with the $Cr^{+}$ ion leading to formation of $Cr^{2+}$ ion in a highly excited state $Cr^{2+*}$:

$$Cr^{+}+e^{+} \rightarrow Cr^{2+*}$$  (8)

Finally this state relaxes to the $^5E$ first excited energy level of $Cr^{2+}$, which radiative decay is accomplished by the emission of a mid-IR photon:

$$Cr^{2+*} \rightarrow Cr^{2+}+h\nu_{MIR}$$  (9)

The second route for $Cr^{2+}$ excitation via photoionization transitions is depicted in FIG. 2 b). Initially, like in process (7), a 532 nm photon ionizes the Chromium ion from a 2+ state to a 1+ state with the generation of a hole in the valence band:

$$Cr^{2+}+h\nu \rightarrow Cr^{+}+e^{+}_{VB}$$  (10)

Next a second pump photon ionizes the Chromium ion from a 1+ state to a 2+ excited state putting an electron in the conduction band:

$$Cr^{+}+h\nu \rightarrow Cr^{2+*}+e^{-}_{CB}$$  (11)

The excited $Cr^{2+*}$, as in equation 9, relaxes to the $^5E$ first excited energy level of $Cr^{2+}$, which radiative decay is then accomplished by emission of mid-IR photon. As one can see, subsequent ionization of $Cr^{2+}$ and $Cr^{+}$ by two 532 nm quanta results not only in emission of an mid-IR quantum, but also in the electron hole pair generation. Further recombination of the electron-hole pair could follow one of the routes of FIG. 1 b), c), d) resulting in $Cr^{2+*}$ emission of a second mid-IR photon.

Experimental Verification of Photoionization Mechanism of TM Excitation

Photoconductance

According to FIG. 2, 532 nm sub-band excitation of $Cr^{2+}$ in ZnSe could lead to photoionization transitions (7-11) accompanied by formation of either hole (FIG. 2 a) or electron and hole carriers (FIG. 2b). Photoconductance measurements of bulk polycrystalline diffusion doped $Cr^{2+}$:ZnSe samples have been performed to verify photoionization mechanisms and show the existence of photo-current under their 532 nm (2.33 eV) sub-band excitation.

Initial photoconduction experiments were performed using a polycrystalline sample 1×4×8 mm clamped between conducting layers of indium. The $2^{nd}$ harmonic (532 nm) of a Nd:YAG laser was incident upon the long edge of the sample and a current was measured utilizing a load resistor of either 1MΩ or 50Ω.

Measurements of photocurrent versus light intensity and bias voltage have been performed. FIG. 3 depicts a photocurrent response of the system detected with a 50Ω load. Comparison of the temporal shape of 532 nm excitation pulse (FIG. 3-1) and photo-conductance voltage on the 50Ω load resistor (FIG. 3-II) shows that the detected photocurrent features a sub-nanosecond response time. This experiment demonstrates fast relaxation (<1 ns) of photo-generated non-equilibrium carriers. Photocurrent signal oscillation was due to the unbalanced impedance of the measurement system.

For the next experiments we used a square sample with side ≈4 mm and contacts on each corner. The contacts are made of indium and soldered to the sample and then the entire sample was heated. Finally the sample was chemically etched with ferric chloride to make the contacts as small as possible (sub 0.5 mm). These measurements were made with a Keithly 237 High Voltage Source Measurement Unit. Supplying a potential across 1-2 contacts and measuring the voltage drop across the two remaining corners (3,4) of the sample for different intensities of the 532 nm excitation shows interesting results (see FIG. 4). The curves show a monotonic response up to a threshold point. After this point the measured voltage drops significantly. After this drop the voltage appears to remain constant despite the applied potential in the forward (1-2) direction. This apparent change in resistance of the sample is caused by current spreading. Once a large enough current is generated the entire crystal conducts. Thus the potential difference between opposite sides is small. Of note is the fact that as the 532 nm radiation intensity is increased, this breakdown point shifts (see FIG. 4). As expected, as the incident 532 nm radiation power increases, the breakdown voltage decreases. This matches with the assumption that the change is due to current spreading, because as the illumination power increases the number of available carries also increases. This dependence of output signals on applied voltages and optical excitation could be of interest for optoelectronic applications.

To identify which of the mechanisms of $Cr^{2+}$ photoionization is more preferable, photo-Hall voltage measurements were performed using a permanent magnet with a surface strength of ≈0.5T and a 532 nm CW source. The sample was within 1mm of the magnet and currents of up to 5 μA were applied. In this regime of applied current the accelerating voltage is above the breakdown threshold described above in FIG. 4. This regime is believed to be the proper region so that a Hall voltage could be observed due to the existence of a current across the entire sample. Performed experiment show that the measured voltages did not change with a change in the polarity of the magnetic field. It can be explained by an equal number of n-type and p-type carriers generated under the 532 nm photo excitation. This implies the mechanism of Cr ionization suggested in FIG. 2b could be accepted as the primary one.

$Cr^{2+}$:ZnSe Mid-IR PL and Lasing via Photoionization Transitions

The polycrystalline samples were prepared from an 1 mm thick ZnSe optical window grown by chemical vapor transport, which was doped by thermal diffusion from a chromium thin film deposited by pulsed laser deposition. Thermal diffusion was performed in a sealed quartz ampoule at $10^{-5}$ torr and a temperature of 1000° C. for 10 days. The PL studies were performed at 300K under optical pumping by pulsed radiation 355, 532, or 1560 nm (~5 ns).

The time dependence of the mid-IR PL emission intensity is depicted in FIG. 5. FIG. 5(i) and 5(ii) demonstrate a pump pulse profile and PL kinetics under intra-shell 1560 nm excitation with fast rise time and ~6 μs exponential decay. FIG. 5(iii) and 5(iv) are PL kinetics for 532 and 355 nm excitations, respectively, exhibiting a relatively slow growth (~3.5 μs) which reaches a peak at ~5 μs, and then decays with decay time of ~6 μs. Identical behavior of PL kinetics under UV and visible excitation indicates that they result from the similar ionization mechanisms. This rise of the PL intensity for 532 and 355 nm excitations implies that $^5E$ population continues to grow long after the duration of the excitation laser pulse due to slow relaxation processes from higher-lying excited levels of $Cr^{2+}$ to the upper laser level $^5E$. At the same time the excited level is pumped at a rate faster than it is depleted and, hence it is reasonable to expect that the population of $^5E$ level could be inverted.

The laser set up consisted of a 3.5 mm thick uncoated plane-parallel 1×9 mm slab of polycrystalline $Cr^{2+}$:ZnSe and a hemispherical resonator formed with a gold mirror with radius 10 cm and a flat output coupler with reflectivity 95%. Pumping was achieved transversely with wavelength 532 nm from the second harmonic of a Nd:YAG Q-switched laser operated at 10 Hz with a pulse length of ≈5 nsec. Lasing of $Cr^{2+}$:ZnSe under 532 nm excitation was obtained and the temporal profiles of the lasing pulses are depicted in FIG. 5 B(i) and 5 B(ii) for 1560 and 532 nm excitations, respectively.

Further evidence of lasing under 532 nm excitation is demonstrated in FIG. 6 showing a threshold dependence of the output input characteristics (FIG. 6A) and significant line narrowing of the emission spectrum (FIG. 6B).

Mid-IR Electroluminescence of n-Type Bulk $Cr^{2+}$ ZnSe

As discussed in [45,46] luminescence can be electrically generated by impact excitation or ionization of impurity levels in semiconductors. In [46] the first observation of mid-IR (~3500 nm) intracenter recombination radiation arising from impact ionization of $Fe^{2+}$ impurities in thin (300 nm) layers of InP at cryogenic temperatures was reported. Conversion efficiency from injected electrical power to mid-IR optical power of $\sim 10^{-4}\%$ was obtained. This small value of conversion efficiency was explained due to the fact that only a small fraction of electrons in the tail of population above the threshold level can impact ionize $Fe^{2+}$. Our objective was to obtain first room temperature mid-IR electroluminescence of bulk (~1 mm thick) n-type $Cr^{2+}$:ZnSe. We hypothesize that if mid-IR electroluminescence of bulk n-type $Cr^{2+}$:ZnSe would be detected, then much more efficient electroluminescence (and lasing) of $Cr^{2+}$ in p-n thin film and especially low dimensional structures could be envisioned.

The n-doped Cr:Al:ZnSe crystals were prepared using a two stage doping process. Pure ZnSe samples were grown using CVD and were doped by successive post-growth thermal diffusions of Cr and Al, respectively. The sizes of samples were about 1×4×4 mm. During the first thermo-diffusion the ZnSe samples were placed on top of Zn and CrSe powder and annealed in sealed evacuated ampoules ($\sim 10^{-5}$ Torr) for seven days at 950° C. for crystal doping with active $Cr^{2+}$ ions. Zinc powder was used in the annealing to prevent the formation of Zn vacancies, and CrSe was used to compensate for sublimation of Se.

The chromium concentration in the samples was controlled using absorption measurements. After the chromium diffusion procedure the average absorption coefficient of Cr:ZnSe samples was about $k=4$ cm$^{-1}$, which corresponds to a $Cr^{2+}$ ions concentration of $N=4\times10^{18}$ cm$^3$.

The n-type samples were obtained by subsequent diffusion of Al impurities [49,50]. The crystals were placed on top of mixture of Zn and Al powders (97 wt. % of Zn and 3 wt % of Al), and again placed in identical evacuated ampoules. They were annealed for 100 hours at 950° C. At the end of the Aluminum annealing, the samples were quickly cooled by immersion in water. Subsequent thermo-diffusion of Al in Cr:ZnSe was accompanied by a ~two-fold decrease of the $Cr^{2+}$ coefficient of absorption. However, $Cr^{2+}$ absorption could still be observed. One of the reasons of the $Cr^{2+}$ suppression could be compensation of divalent chromium by donor impurities in Cr:Al:ZnSe samples. Another reason relates to necessity to polish crystal faces after thermal diffusion of Al. Since the largest chromium concentration is near the surface of the crystal, the polishing might result in the removal of some amount of chromium dopant.

The emission spectra of $^5T_2 \leftrightarrow ^5E$ transition of the Cr:ZnSe and Cr:Al:ZnSe samples under optical excitation were identical and in a good agreement with the published data [9,10, 34].

The procedure of formation of Ohmic contacts with indium as a contact material was performed as follows: in the beginning, the surfaces of the samples were slightly polished and cleaned to avoid surface conductivity effects. After drying, the crystal was heated to about 120° C. and liquid Indium was applied to the facet of the crystal. Once the Indium wet the surface and spread evenly over it, the crystals were placed on an uncoated side and heated to about 250° C. for several minutes. This heating allowed near-surface diffusion of Indium necessary for proper contact formation [51].

The conductivity of the crystals was verified by I-V measurements in the 0-120V range of potential differences across the sample with a series resistor of R=84.5Ω. To avoid self-induced overheating, the measurements were performed with a HP 214B Pulse Generator with a pulse duration of ~100 μs and repetition rate of 8 Hz. The I-V measurements demonstrated that before the aluminum doping procedure the Cr:ZnSe sample had a high resistivity $\rho > 10^{10}$ $\Omega \cdot$cm. In n-type Al-doped samples the dark resistivity at room temperature was decreased down to a value of $\rho = 10^4 - 10^2$ $\Omega \cdot$cm. The deviations in the samples conductivity were due to differences in the parameters of the annealing process. The I-V characteristic of the Al—Cr:ZnSe crystal demonstrating the most intensive mid-IR electroluminescence is depicted in FIG. 7. As one can see from the FIG. 7A the I-V curve features quasi-Ohmic behavior with $R \approx 53$ k$\Omega$ ($\rho = 84$ k$\Omega \cdot$cm) for small (<2V) voltages across the sample. However, as shown in FIG. 7B for voltages across the sample larger than 2 V the I-V curve feature nonlinear behavior with differential resistance of $R = 3.8$ k$\Omega$ for voltages of the order of 100V. This behavior of the sample could not be explained by the simple heating of the sample during measurements. The sample heating should have result in the current growth at the end of the pulse. However, at low frequencies of operation of the pulse generator there were no changes in the temporal profile of the current through the sample for the whole range (up to 100V) of applied voltages. One of the possible reasons of such behavior could be irregular contact formation on the facet of polycrystalline ZnSe sample. These irregularities could result in simultaneously pure Ohmic and Schottky behaviors for different parts of the sample. Another explanation of such behavior of the sample could be related to the formation of "conductive" channels through the sample at the stage of n-doping. In this case the nonlinear behavior of the I-V curve could be explained by a large current density in these channels. FIG. 8A shows a temperature dependence of the current through the sample. As one can see, sample heating till 70° C. results in a 7-fold decrease of the sample resistance with respect to the room temperature value.

Electroluminescence of the n-type Cr:Al:ZnSe samples was studied in the visible, near- and mid-IR spectral regions using photomultiplier, InSb, and HgCdTe detectors. Excitation pulses with peak values up to 100V and 19-70 μs duration were applied to the samples. Initially signal from electrically excited Cr:Al:ZnSe sample was detected without spectrometer with the use of a 2-3 μm bandpass filter and a InSb detector. FIG. 9 shows the typical temporal profiles of the voltage across the sample (I) and the detected mid IR optical signal (II). Optical signals were measured using a InSb detector with the time constant of the detector-preamplifier being ~0.5 μs. It is clear that the infrared signal observed in the 2-3 μm spectral range is due to electrical excitation, as it is perfectly in phase with the excitation pulses.

FIG. 8B demonstrates the dependence of the amplitude of the mid-IR electroluminescence versus temperature. In the range of temperatures from room to 55° C. the ascent of the intensity of the optical signal could be explained by the increase of the current amplitude, which happens due to the temperature dependent decrease of the sample resistivity. The decrease in the intensity of the optical signal for temperatures above 55° C. is due to the temperature induced decrease of the $Cr^{2+}$ quantum efficiency of luminescence.

The mid-IR electroluminescence spectrum of Cr:Al:ZnSe is depicted in FIG. 10B curve II. As one can clearly see the Cr:Al:ZnSe electroluminescence is in a good agreement with PL of the same sample measured under direct optical $^5T_2 \leftrightarrow {}^5E$ excitation (curve-II).

It was also revealed that under electrical excitation in addition to $Cr^{2+}$ mid-IR electroluminescence there exist luminescence signals in two other spectral bands. FIG. 10A demonstrates a strong visible emission band detected near 600 nm. It was visible even with the naked eye. Some authors assign this emission to $V_{Zn}$-Al complex in conductive crystals [49].

In addition to these bands the luminescence band around 8 μm was also observed under electrical excitation. The nature of the 8 μm electroluminescence is not yet understood at this time.

Inter-Band and Intra-Shell Excitation of $Cr^{2+}$ and $Fe^{2+}$ in Low-Dimensional II-VI Structures There are numerous publications related to preparation, luminescence properties and potential applications of $Mn^{2+}$: II-VI nanoparticles. The interest to this phosphor was stimulated by Bhargava [52] whose most fundamentally interesting result was luminescence enhancement resulting from efficient energy transfer from the ZnS nanocrystals to $Mn^{2+}$ ions facilitated by mixed electronic states. Regarding Cr and Fe doped II-VI nanocrystals their photo-physical properties have not yet been addressed. It is believed that similarly to Mn doped ZnS nanocrystals, one can expect an efficient energy transfer from the low dimensional II-VI structures to $Cr^{2+}$ and $Fe^{2+}$. Fast energy transfer from the low-dimensional host to $Cr^{2+}$ and $Fe^{2+}$ can be qualitatively explained by the increase of the exciton oscillator strength bound to the impurity center. First of all, quantum size confinement should increase the oscillator strength of the free exciton due to an increase of the electron-hole overlap factor. Secondly, the oscillator strength of the exciton bounded to the impurity center depends on the oscillator strength of the free exciton and electron-hole exchange interaction term which is also supposed to be large due to the carrier's confinement. Thus, we may expect a large enhancement of the oscillator strength of the exciton bound to the impurity embedded in nanostructured materials with respect to bulk hosts. Thirdly, characteristic spatial dimension of the confinement can be further tuned by changing the size of the doped quantum dot to enable optimal overlap of the discrete levels of the host and impurity ions and further enhance the energy transfer from the separated host carriers to the impurity. Another important issue that was successfully proven by Tanaka [53] for Mn doped II-VI nanocrystals relates to remarkable differences in thermal quenching of TM d-d PL in nanocrystals and bulk materials. First of all, the density of states for both electron and phonons decreases with size. This is likely to result in weaker electron-phonon coupling opening a pathway for development of a mid-IR light emitting nanostructured material with high RT quantum efficiency of PL under intra-shell IR optical excitation. Hence, $Fe^{2+}$ doped bulk II-VI lasers can operate efficiently only at liquid nitrogen temperature (LNT), whereas $Fe^{2+}$ doped nanostructured materials might lase at RT. On the other hand, the increased overlap between the electron and hole wave functions decreases the exciton-phonon coupling. Analogously to Mn in ZnS, such nanostructured materials are supposed to provide much weaker thermal quenching of $Fe^{2+}$ in nanocrystals than that of the bulk crystals. This analysis provides a background for the remarkable differences that could be expected in excitation of $Cr^{2+}$ and $Fe^{2+}$ ions in nanostructures with respect to the bulk crystals.

We envision two promising roots for achieving $TM^{2+}$:II-VI mid-IR lasing under electrical excitation:

a) Electrical excitation of II-VI nanocrystals co-activated by transition metals and dispersed in a conductive matrix and b) Electrical excitation of doped II-VI heterostructures a) Electrical Excitation of II-VI Nanocrystals Co-Activated by Transition Metals and Dispersed in a Conductive Matrix Recently, chemically synthesized semiconductor nanoparticles attracted much attention as a potential easily tunable optically and electrically pumpable gain media. First demonstration of an optically pumped semiconductor nanocrystal laser was given by Klimov's group at LANL [54]. Electrically pumped room-temperature lasing from a CdSe quantum dot stack separated by ZnSSe spacer layers of high S content has been reported at a wavelength around 560.5 nm with threshold current density of 7.5 kA/cm² [55]. Klimov et al. in [54] determined the required material and optical parameters to realize gain in close packed films of semiconductor nanocrystals. Good surface passivation, narrow size distribution, low re-absorption by the host material at the lasing frequencies, and high (>0.002) volume fraction of nanoparticles in the host material are the major issues for achieving stimulated emission. The approach of utilization of II-VI nanocrystals co-activated by TM and dispersed in a conductive matrix for achieving mid-IR lasing under direct electrical excitation is based on three innovative ideas combined in one system. The first key element of the system utilizes above mentioned principles of electrical excitation of closed pack films of undoped nanocrystals [54] and light emitting diodes (LEDs) designed [56] using semiconductor nanocrystallites (quantum dots) dispersed in a matrix. Using this approach Alivisatos [56] produced LEDs with high conversion efficiencies by utilizing quantum dots embedded in polymer matrices. The second key element relates to the fact that although nanocrystallites have not yet completed their evolution into bulk solids, structural studies indicate that they have the bulk crystal structure and lattice parameter [57]. This fact provides a strong foundation for our hypothesis that similarly to the bulk II-VI crystals, tetrahedral coordination of $TM^{2+}$ centers in II-VI nanocrystallites will provide a small crystal field splitting and place the dopant transitions into the mid-IR. The third key element of the system utilizes the "quantum-confined atoms" approach proposed recently by Bhargava [58]. Because the radii of the excited states of an impurity (0.1 to 1 nm) are significantly smaller than the typical Bohr radii of exciton in semiconductors (3-10 nm) the wavelength of the impurity characteristic fluorescence should hardly change, whereas the spectroscopic characteristics such as oscillator strength and intensity of the mid-IR transition can be modulated by quantum confinement. The most interesting results, in the case of the quantum confined impurity, are an efficient energy transfer from the host nanocrystal to the impurity accompanied by the relaxation of the selection rules for intrashell transitions of $TM^{2+}$ ions and corresponding fluorescence enhancement, which was verified for $ZnS:Mn^{2+}$ nanocrystals by several authors [59,60].

Several geometries of the electrically pumped nanocomposite laser could be utilized. The simplest one will be formed from simple metal-nanocomposite polymer-metal heterojunctions. Another, more sophisticated structure is shown schematically in FIG. 11. The clad layer conductive polymer will be spin coated on the $n^+$ substrate. The doped nanocrystal/polymer blend will be spin coated onto the clad layer. Another conductive polymer p clad layer will be spin coated on the top of the active region. Finally, Ag or Al layer will be thermally evaporated on the clad layer to form P contact. Dielectric mirrors will be deposited on the edges of the structure to form high reflective and output couplers in the spectral region 2-5 μm. Basically, this structure is analogous to standard double heterostructure diode laser. Utilization of the two cladding polymer layers with indices of refraction smaller than the index of refraction for the active film provides a good confinement of the electromagnetic wave being amplified.

b) Electrical Excitation of Doped II-VI Heterostructures

For decades, the wide-band-gap II-VI semiconductors, particularly ZnSe, have been called promising materials for the fabrication of visible LEDs and lasers. The lifetime of II-VI based LEDs already exceeds 10,000 hours [61]. We believe that utilization of II-VI heterostructures with active layer co-activated by transition metals is a promising route for achieving broadly tunable mid-IR lasing under direct electrical excitation. The structure of the lasers could be similar to double heterojunction blue-green lasers based on a ZnMgSSe alloy forming a type I heterostructure with ZnCdSe [62], where the active ZnCdSe layer is doped by $Cr^{2+}$ or $Fe^{2+}$ ions. The layer should be QW or QD and in addition to simultaneous confinement of carriers and photons the effective (due to phenomena of quantum confinement) energy transfer from the host to the emitting ion is provided. In order to obtain II-VI:$TM^{2+}$ QW structures exhibiting true 2-D effects for electrical excitation, the structures similar to what is depicted in FIG. 12 are of interest. This design is derived from a separate-confinement heterostructure configuration utilizing cladding and guiding layers based on the ZnMgSSe quaternary alloy system, lattice matched to the GaAs substrate [63,64]. This configuration has been successful in low threshold current blue-green lasers based on II-VI materials [65, 66]. Active layer is a single strained quantum well of $Zn_{1-x}Cd_xSe:TM^{2+}$ with the choice of x=0.2. This alloy composition leads to an energy gap of 2.5 eV (compared to $E_g$=2.7 eV of guiding layer). The whole structure is pseudomorphic to the GaAs substrate and presents efficient confinement of both carriers and optical field. This should enable easier light collection in luminescence and stimulated emission studies. The structure also features a capping layer of ZnSSe to prevent chemical changes on the active layer and limit density of surface states directly affecting the QW layer.

Because of its success in the fabrication of device quality II-VI and III-V semiconductor layers over the past 20 years, MBE emerges as a natural candidate for the deposition of the structure depicted in FIG. 12 [63,64]. MBE has played such an important role in the fabrication of similar structures, because it is able to prepare compositionally sharp interfaces with atomic layer precision of the designed device over a large substrate area. MBE is an outstanding choice for growth of the cladding and guiding layers in our structures, however, other methods (e.g. CVD, PLD) can be used.

First Experimental Realization of Mid-IR Highly Fluorescent DQCH Material

The majority of methods of metal and semiconductor nanoparticles synthesis is based on chemical approaches in which a variety of functional groups are used to stabilize nanoparticles and serve as a capping agents. Several approaches based on sol-gel chemical processing of II-VI precursor compounds have been developed to produce ZnSe and ZnS nanoparticles with low size dispersion (5-10%) [67, 68,69,70,71,72,73]. It is believed that solgel technology can be used for fabrication of highly fluorescent DQCH materials. The shortcoming of this approach is that a various byproducts of a chemical reaction may also interact with nanoparticles and are difficult to remove from nanoparticles surface. An entirely physical approach of fabrication of metal and semiconductor nanoparticles, such as laser ablation, enables synthesis of pure uncapped nanoparticles. Recently laser ablation was used to prepare various semiconductor nanoparticles in liquid environment [74,75]. However, formation of semiconductor nanoparticles doped with transition metal ions under laser ablation was not reported so far. Here we propose the fabrication of II-VI NCD doped with TM (Cr, Co and Fe) ions by laser ablation method.

TM doped ZnSe and ZnS nanoparticles were prepared using multi-stage process. Initially, polycrystalline ZnSe and ZnS samples were grown using CVD and were TM (Cr, Co, Fe) doped by post-growth thermal diffusion. During the thermo-diffusion the ZnSe and ZnS samples were annealed in sealed evacuated ampoules with CrSe (CoSe, FeSe) or CrS powder for seven days at 950° C. The average TM ions concentration was $10^{18}$-$10^{19}$ cm$^{-3}$.

At the first stage of NCD preparation, bulk polycrystalline TM doped ZnS and ZnSe samples were ablated in pure distilled and deionizer water by the radiation of fundamental harmonic radiation of Nd:YAG laser (EXPLA PL2143) with pulse duration 30 ps, repetition rate 10 Hz, and pulse energy of 10 mJ. Laser radiation was slightly focused on the surface of the bulk samples to the spot size of 2 mm. The formation of nanoparticles was observable due to creation of colloidal suspension and coloration of the solution.

At the second stage of preparation, ZnS or ZnSe nanoparticles suspension was sonicated in order to break large aggregates. The suspension was further irradiated by the radiation of the third harmonic (355 nm) of the Nd:YAG laser (EXPLA PL2143) with pulse duration 30 ps, repetition rate 10 Hz, and pulse energy of 15 mJ. The laser beam with 1 cm in diameter was directed in to the optical cell without focusing. Initially blurry nanoparticles suspension became clear after 10 minutes of irradiation.

For mid-IR spectroscopic characterization, precipitated nanoparticles were extracted from aqueous solution, washed with distilled-deionizer water and dried naturally under ambient condition.

The NCD samples were investigated using x-ray diffraction (XRD) to determine the crystalline grain size range. This XRD measurements were performed using (θ-2θ) angle x-ray diffraction (Philips X-Pert MPD, The Netherlands) with a Cu K-alpha anode. Spectra were taken from 20° to 60° 2-theta. The XRD pattern shown in FIG. 13-A (a) corresponds to the initial Cr doped polycrystalline ZnS sample used for ZnS-NQD preparation. The most prominent diffraction peaks located at 2θ=28.6°; 47.5° and 56.4° coincide with (111); (200); (220) and (311) reflections of the zinc-blend structure. Cr:ZnS nanocrystals obtained after the first stage of laser irradiation exhibit XRD pattern (FIG. 13A-b) with several additional peaks characteristic to the wurtzite ZnS (100); (101); (102); (110) and (103). The other peaks of the wurtzite structure (002); (110) and (112) overlap with main peaks of the zinc-blend structure (111); (220) and (311). These results indicate that after the first stage of nanoparticles preparation they have mixed wurtzite and zink-blend structure. From the width of the XRD peak, mean crystalline size can be calculated using Scherrer's equation: $D=k\lambda/B\cos(2\theta)$, where $\lambda$ is X-ray wavelength (for Cu Kα, $\lambda=0.154$ nm), 2θ-diffraction angle; B is the measured full width at half max (FWHM) of the XRD peak, and k=0.9. XRD pattern (see FIG. 13A-c) of ZnS NQD prepared after the second stage of laser UV treatment exhibits significant peak broadening. After the first stage and second stages of preparation, the mean crystal sizes of doped ZnS nanoparticles were estimated to be 11 and 3 nm, respectively. Similar results were obtained in the case of ZnSe nanocrystals prepared by 1064 nm laser ablation. Polycrystalline ZnSe target (see FIG. 13 B-a) has XRD peaks at 2θ=27.2°; 45.1° and 53.4° corresponding to (111), (220) and (311) planes reflection of cubic ZnSe. As one can see in FIG. 13-B (b), ZnSe nanocrystals had peaks corresponding to wurtzite structure and peaks width was broadened due to formation of relatively small nanocrystals. An average nanocrystal size after the first stage of fabrication was estimated to be ~13 nm. It is noteworthy that we have not observed any additional peaks associated with ZnO or other impurities that could be produced at the stage of laser ablation.

After the first stage of preparation, absorption spectrum of the ZnS NQD reveals two minor absorption shoulders peaking at 295 and near 350 nm. After the second stage, the absorption peak at 350 nm disappears while the first peak is slightly blue shifted to 290 nm. We assume that this band is associated with excitonic absorption of ZnS NQD. The blue shift of absorption band indicates strong quantum size effect. The sizes of the NCD could be estimated using the approximation equation [76] and is approximately equal to 3 nm, which is quite consistent with the XRD analysis.

Spectroscopic characteristics of Cr, Co, and Fe doped NCDs in mid-IR spectral region were studied under 1.6 μm and 2.8 μm laser excitations. Room-temperature fluorescence spectra of Cr:ZnS and Cr:ZnSe NCDs are shown in the FIGS. 14A and 15A. The luminescence spectra of bulk crystals obtained at the same experimental conditions are shown on the same graphs for comparison. Luminescence bands of ZnS and ZnSe NCDs were blue shifted compared to the bulk crystals as can be seen in the FIGS. 14A and 15A.

There are several possible explanations of this phenomenon. One of the most probable reasons affecting the shape of luminescence spectrum is absorption of OH groups that possibly present on the surface of nanoparticles. A strong NCD luminescence signal suppression of wavelengths longer then 2600 nm comparing to bulk crystals strongly supports this hypothesis.

Another fact that further supports influence of OH group absorption is that luminescence maximum shift is more prominent in ZnSe nanoparticles since luminescence band of bulk ZnSe in located closer to the absorption band of OH group. Another cause of luminescence shift could be alteration of the strength of the crystal field in nanoparticles.

Luminescence kinetics of ZnS and ZnSe NCDs at RT and 77K are given in FIG. 14-B and FIG. 15-B, correspondingly. ZnS nanoparticles luminescence lifetime was smaller, down to 2.6 μs, comparing to 6 μs typical to the bulk crystals. However, at 77 K NQD luminescence lifetime was 5 μs, which is close to one in bulk sample. Thus we conclude that the major factor responsible for shorter $Cr^{2+}$ excited state lifetime in nanoparticles is increased probability of non-radiative relaxation.

We have observed shorter $Cr^{2+}$ excited state lifetime in the Cr:ZnSe NCDs as well.

Absorption spectra of $Co^{2+}$ ($d^7$) doped II-VI semiconductors in middle IR region have two bands associated with transitions $^4A_2 \rightarrow {}^4T_1$ (~1500 nm) and $^4A_2 \rightarrow {}^4T_2$ (~3000 nm) [9]. $^4A_2 \rightarrow {}^4T_2$ transition is relatively weak since it is symmetry-forbidden [9]. Luminescence spectra of $^4A_2 \rightarrow {}^4T_2$ transition in Co:ZnSe quantum dots and bulk crystal excited to $^4A_2 \rightarrow {}^4T_1$ (~1600 nm) at room temperature are shown in FIG. 16A. It can be seen that $Co^{2+}$ luminescence is strongly suppressed in 2800 nm region, which is another confirmation of OH group absorption influence to the TM luminescence in 3000 nm region. The lifetime of the excited $^4T_2$ state at room temperature in bulk crystal was ~200 μs. Cooling of the sampled down to 77K led to increase of excited state life time to 1.1 ms (see FIG. 16 B), which is in good agreement with previously reported values [9]. We have not observed buildup of luminescence due to population of $^4T_2$ state, which is evident to fast excitation relaxation from $^4T_1$ to $^4T_2$ states. Luminescence kinetics of Co:ZnSe nanoparticles at room temperature (see FIG. 16B) was similar to kinetics in bulk and the decay time was 220 μs. Thus we conclude that in Co ions doped samples there was no increase of non-radiative relaxations.

The $^5D$ ground state of the $Fe^{2+}$ ($3d^6$) in the tetrahedral crystal field ($T_d$) of ZnSe crystal is split into the doublet $^5E$ and triplet $^5T_2$, while the doublet $^5E$ is the ground state of the iron ions, and the triplet $^5T_2$ is first excited state. The energy difference between the $^5E$ state and the $^5T_2$ state for $Fe^{2+}$ ions in ZnSe crystal field corresponds to the mid-IR spectral region [9]. Room-temperature luminescence spectra of Fe:ZnSe bulk and Fe:ZnSe NCDs on the $^5T_2 \rightarrow {}^5E$ transition excited by the free running radiation of Er:Cr:YSGG laser (2.8 μm) are shown in the FIGS. 17(ii) and 17(i), respectively. The luminescence spectra of bulk crystals obtained at the same experimental conditions are shown on the same graphs for comparison.

It is noteworthy that luminescence spectra of Fe doped ZnSe bulk and ZnSe NCDs are completely identical. As one can see, at room temperature $Fe^{2+}$:ZnSe features a broadband (3.5-5.2 μm) luminescence with a characteristic dip at 4.25 μm caused by absorption of atmospheric $CO_2$.

Hence, we have demonstrated a novel method of TM doped II-VI NCD fabrication based on laser ablation in liquid environment. This technique has considerable advantage over chemical synthesis of doped II-VI NCDs due to possibility of doping nanocrystals with a variety of TM ions using laser ablation of thermo-diffusion doped polycrystalline II-VI targets. For the first time to our knowledge TM doped II-VI NCD demonstrated strong mid-IR luminescence. It opens a new pathway for future optically and electrically pumped mid-IR lasers based on TM doped quantum confined structures.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size, and arrangement of parts. For example, equivalent elements or materials may be substituted for those illustrated and described herein, and certain features of the invention may be utilized independently of the use of other features, all as would be apparent to one skilled in the art after having the benefit of this description of the invention.

What we claim is:

1. A semiconductor gain medium in an electrically pumped broadly tunable mid-infrared laser, the semiconductor gain medium comprising:
    doped quantum confined host material (DQCH) structured to have characteristic spatial dimension of the confinement tuned to enable overlap of discrete levels of the host and impurity ions for efficient energy transfer from separated host carriers to the impurity, and lasing in mid-infrared range of wavelengths, wherein: said DQCH material has the formula TM:MeZ and/or $MeX_2Z_4$, wherein Me is selected from the group consisting of Zn, Cd, Ca, Mg, Sr, Ba, Hg, Pb, Cu, Al, Ga, In; Z is selected from the group consisting of S, Se, Te, O, N, P, As, Sb and their mixtures; X being selected from the group consisting of Ga, In, and Al; and TM is selected from the group consisting from V, Cr, Mn, Fe, Co, and Ni.

2. The semiconductor laser gain medium of claim 1, wherein said DQCH material comprises quantum dots embedded in electroconductive bulk inorganic or polymer host.

3. The semiconductor laser gain medium of claim 1, wherein said DQCH material comprises an active layer of quantum dots as integral part of a double heterostructure system providing simultaneous confinement of carriers and photons in the active layer.

4. The semiconductor laser gain medium of claim 1, wherein said DQCH material comprises crystals with at least one two dimensional quantum well active layer as integral part of a double heterostructure system providing simultaneous confinement of carriers and photons in the active quantum well layer.

5. The semiconductor laser gain medium of one of claims 1-4, wherein said DQCH material is selected from the group consisting of ZnS, ZnSe, ZnTe, CdS, CdSe, CdTe and their mixtures.

6. The semiconductor laser gain medium of claim 5 wherein said transition metal ions are selected from the group consisting of Fe, Cr and Co ions.

7. The semiconductor laser gain medium of claim 1, wherein said DQCH material contains TM ions in concentrations of between about $10^{16}$ to $10^{20}$ per cubic centimeter of material.

8. The semiconductor laser gain medium of claim 6, wherein said DQCH material contains TM ions in concentrations of between about $10^{17}$ to $10^{19}$ per cubic centimeter of material.

9. The semiconductor laser gain medium as defined in claim 8, wherein said DQCH material has characteristic spatial dimension of the confinement less than about 100 nanometers.

10. The semiconductor laser gain medium as defined in claim 9, wherein said DQCH material has characteristic spatial dimension of the confinement between about 1 to 15 nanometers.

11. A mid-infrared tunable laser system comprising:
    a) excitation means associated with the DQCH gain material providing electrical excitation of the DQCH material and active TM ions
    b) DQCH gain material as of one of claims 1-4 coupled to said excitation means
    c) A dispersive positive feedback coupled to said excitation means and DQCH to tune said output radiation in the mid-IR spectral range.

12. In a middle infra red laser, an improvement comprising, an electrically excitable doped quantum confined host material selected from crystals doped with transition metal ions, with characteristic spatial dimension of the confinement enabling overlap of discrete levels of the host and transition metal ions for efficient energy transfer from separated host carriers to the transition metal ions and with strong luminescence in a widely tunable mid-IR range.

13. The improvement as defined in claim 12 wherein said doped quantum confined host material has the formula: TM:MeZ and/or $MeX_2Z_4$, wherein Me is selected from the group consisting of Zn, Cd, Ca, Mg, Sr, Ba, Hg, Pb, Cu, Al, Ga, In; Z is selected from the group consisting of S, Se, Te, O, N, P, As, Sb and their mixtures; X being selected from the group consisting of Ga, In, and Al; and TM is selected from the group consisting from V, Cr, Mn, Fe, Co, and Ni.

14. The improvement as defined in claim 13 wherein said transition metal ions are selected from the group consisting of Fe, Cr and Co ions.

15. The improvement as defined in claim 13 wherein said transition metal ions are selected from the group consisting of Fe, Cr and Co ions.

16. The improvement as defined in claim 13 wherein said transition metal ions are present in said doped quantum confined host material in concentrations of between about $10^{16}$ to $10^{20}$ per cubic centimeter of material.

17. The improvement as defined in claim 13 wherein said transition metal ions are present in said doped quantum confined host material in concentrations of between about $10^{17}$ to $10^{19}$ per cubic centimeter of material.

18. The improvement as defined in claim 13 wherein said doped quantum confined host material has characteristic spatial dimension of the confinement less than about 100 nanometers.

19. The improvement as defined in claim 13 wherein said doped quantum confined host material has characteristic spatial dimension of the confinement between about 1 to 15 nanometers.

20. The semiconductor gain medium of claim 1, wherein the DQCH is structured using laser ablation in a liquid, gas or vacuum environment.

* * * * *